(12) United States Patent
Zang et al.

(10) Patent No.: US 12,471,394 B2
(45) Date of Patent: Nov. 11, 2025

(54) CENTRAL DEEP TRENCH ISOLATION SHIFT

(71) Applicant: OMNIVISION TECHNOLOGIES, INC., Santa Clara, CA (US)

(72) Inventors: Hui Zang, San Jose, CA (US); Chao Niu, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 581 days.

(21) Appl. No.: 17/680,045

(22) Filed: Feb. 24, 2022

(65) Prior Publication Data

US 2023/0268357 A1 Aug. 24, 2023

(51) Int. Cl.
| | | |
|---|---|---|
| *H10F 39/00* | (2025.01) | |
| *H10F 39/12* | (2025.01) | |
| *H10F 39/18* | (2025.01) | |

(52) U.S. Cl.
CPC ........... *H10F 39/802* (2025.01); *H10F 39/18* (2025.01); *H10F 39/182* (2025.01); *H10F 39/199* (2025.01); *H10F 39/8023* (2025.01); *H10F 39/8027* (2025.01); *H10F 39/8053* (2025.01); *H10F 39/8063* (2025.01); *H10F 39/807* (2025.01); *H10F 39/809* (2025.01); *H10F 39/811* (2025.01); *H10F 39/804* (2025.01); *H10F 39/813* (2025.01)

(58) Field of Classification Search
CPC ......... H01L 27/14603; H01L 27/14621; H01L 27/14627; H01L 27/1464; H01L 27/14605; H01L 27/14607; H01L 27/1463; H01L 27/14641; H01L 27/14643; H01L 27/14645; H01L 27/14618; H01L 27/14634; H01L 27/14636; H01L 27/14629; H10F 39/802; H10F 39/18; H10F 39/182; H10F 39/199; H10F 39/8023; H10F 39/8027; H10F 39/8053; H10F 39/8063; H10F 39/807; H10F 39/809; H10F 39/811; H10F 39/804; H10F 39/813

See application file for complete search history.

(56) References Cited

U.S. PATENT DOCUMENTS

| | | | |
|---|---|---|---|
| 10,224,364 B2 | 3/2019 | Zhao et al. | |
| 2021/0183920 A1* | 6/2021 | Lee | H10F 39/014 |
| 2021/0366956 A1* | 11/2021 | Wu | H01L 27/14621 |
| 2022/0377262 A1* | 11/2022 | Moon | H04N 25/46 |
| 2023/0326944 A1* | 10/2023 | Morimoto | H01L 31/0232 |
| | | | 257/432 |
| 2024/0170517 A1* | 5/2024 | Nishida | H04N 25/70 |
| 2024/0178254 A1* | 5/2024 | Nakazawa | H01L 31/022408 |

* cited by examiner

*Primary Examiner* — Jennifer D Bennett
*Assistant Examiner* — Erin R Garber
(74) *Attorney, Agent, or Firm* — Christensen O'Connor Johnson Kindness PLLC

(57) ABSTRACT

Image sensors include a pixel array arranged about an array center, each pixel of the pixel array having a photodiode formed in a semiconductor substrate, and a central deep trench isolation structure disposed in the semiconductor substrate relative to a pixel center between the photodiode and an illuminated surface of the semiconductor substrate. If the pixel center is not coincident with the array center, then the central deep trench isolation structure is disposed at a CDTI shift distance away from the pixel center.

12 Claims, 7 Drawing Sheets

CENTRAL DEEP TRENCH ISOLATION SHIFT

BACKGROUND

This disclosure relates generally to semiconductor image sensors, and in particular but not exclusively, CMOS image sensors having central deep trench isolation (CDTI) structures.

Image sensors are ubiquitous. They are widely used in digital cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In some backside illuminated (BSI) pixels where low-level light performance is important, CDTI structures are utilized to improve Quantum Efficiency (QE). However, such CDTI structures may cause crosstalk between pixels or other adverse effects.

The present disclosure provides structures which alleviate these disadvantages.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

Figure 1:
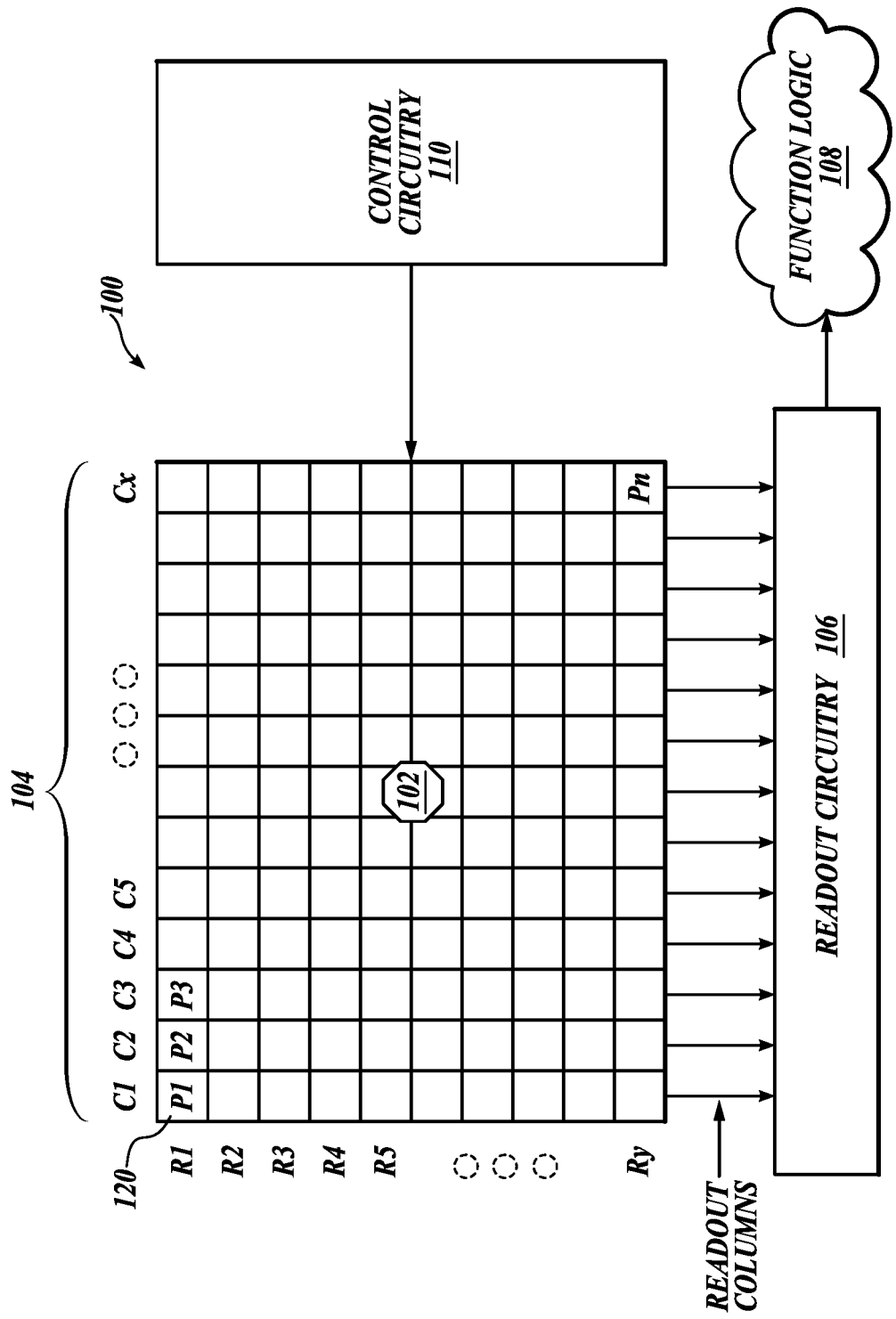
FIG. 1 is a block diagram illustrating an embodiment of an image sensor in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

The present disclosure is directed to image sensors, and in particular, to image sensors having CDTI structures as defined below. To facilitate understanding, the present disclosure describes CDTI structures in the context of complementary metal-oxide-semiconductor ("CMOS") image sensors. However, it shall be appreciated that the invention shall not be limited to CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "in some embodiments" or "in an embodiment" in various places throughout this specification are not necessarily all referring to the same example. Furthermore, the particular features, structures, or characteristics of any embodiment may be combined with any features of any other embodiment to arrive at still other embodiments within the scope of the present disclosure.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning. Terms having alike names have alike meanings with respect to different embodiments, except where expressly noted.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "underneath" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

The present application may also reference quantities and numbers. Unless specifically stated, such quantities and numbers are not to be considered restrictive, but representative of the possible quantities or numbers associated with the present application. Also, in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed. The phrase "at least one of A, B, or C" has the same meaning.

FIG. 1 is a diagram illustrating one example of a representative image sensor 100 with a pixel array 104 of pixels 120. As shown, the pixel array 104 is coupled to a readout circuitry 106 (which is coupled to a function logic 108) and to a control circuit 110.

Pixel array 104 is a two-dimensional ("2D") array of pixels 120 (e.g., pixels P1, P2 . . . , Pn). The overall pixel array 104 has an array center 102 representing a geometric center, which may or may not correspond to a center of an individual pixel 120. In any embodiment described herein, the array center 102 may be defined as the geometric center of the pixel array. Alternatively, in any embodiment described herein, the array center 102 may be defined as an intersection between at lease a first line of symmetry and a second line of symmetry of the pixel array 104. The array center 102 is one reference point relative to which elements of individual pixels 120 are shifted as described below. However, the array center 102 is not the only reference point relevant to such shifts. The geometric center of each individual pixel 120 (i.e., the pixel center) is also relevant to such shifts.

In one embodiment, each pixel 120 is a complementary metal-oxide-semiconductor ("CMOS") imaging pixel. Pixel array 104 may be implemented as a backside illuminated image sensor array. In some embodiments, one or more of pixels 120 include one or more pixel elements as described below, including one or more lenses, color filters, CDTI structures, grids, vertical transfer gates, floating diffusions, source follower transistors, row select transistors, and reset transistors. As illustrated, the pixels 120 are arranged into rows (e.g., rows R1 to Ry) and columns (e.g., column C1 to Cx) to acquire image data of a person, place, or object, which can then be used to render a 2D image of the person, place, or object.

After a pixel 120 has acquired its image data or image charge, the image data is readout by readout circuitry 106 and transferred to function logic 108. Readout circuitry 106 may include amplification circuitry, e.g., a differential amplifier circuitry, analog-to-digital ("ADC") conversion circuitry, or otherwise. In some embodiments, the readout circuitry 106 may readout a row of image data at a time along readout column lines (illustrated) or may readout the image data using a variety of other techniques (not illustrated), such as a serial readout or a full parallel readout of all pixels 120 simultaneously.

Function logic 108 includes logic and memory for storing the image data or even manipulating the image data by applying post image effects (e.g., crop, rotate, remove red eye, adjust brightness, adjust contrast, or otherwise).

Control circuit 110 is coupled to pixels 120 and includes logic and memory for controlling operational characteristics of pixels 120. For example, control circuit 110 may generate a shutter signal for controlling image acquisition. In some embodiments, the shutter signal is a global shutter signal for simultaneously enabling all pixels 120 to simultaneously capture their respective image data during a single acquisition window. In some embodiments, the shutter signal is a rolling shutter signal whereby each row, column, or group of pixels 120 is sequentially enabled during consecutive acquisition windows.

Figure 2:
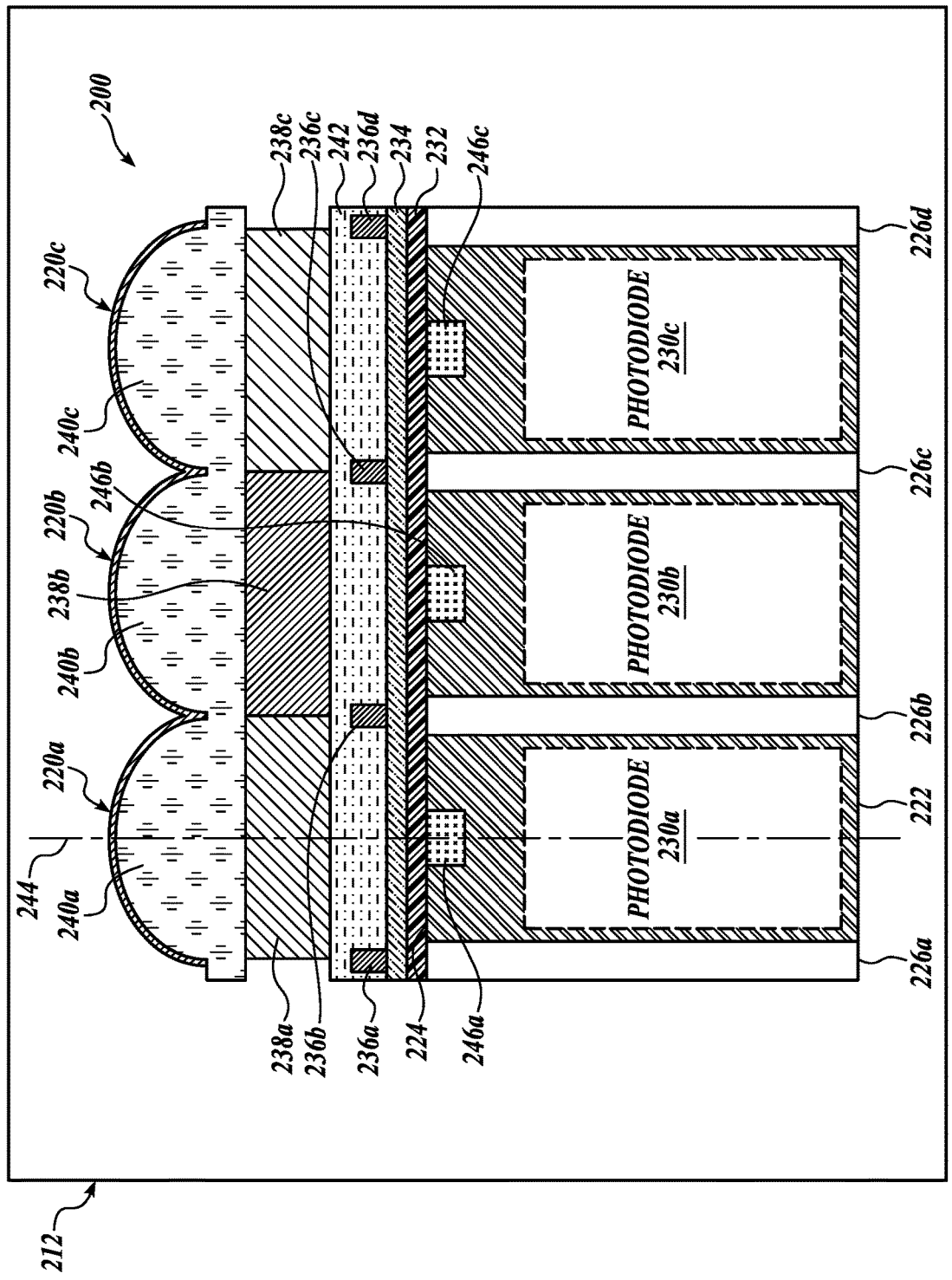
FIG. 2 is a schematic cross section of a pixel comprising a lens, a color filter, and a CDTI structure.

FIG. 2 is a schematic cross section of a portion of an image sensor 200, such as shown in FIG. 1. The image sensor 200 is embodied in a device 212, e.g., a camera, a smartphone camera, a vehicle camera, an endoscope or other medical device, etc., and includes a plurality of pixels 220a-c formed as described below.

The image sensor 200 includes a semiconductor substrate 222, such as a single crystal silicon substrate, a semiconductor on insulator (SOI) substrate, a doped silicon bulk substrate, an epitaxial film on semiconductor (EPI) substrate, or the like. Semiconductor substrate 222 has a plurality of photodiodes 230a-c formed therein, e.g., doped portions of the semiconductor substrate 222 configured to photogenerate and accumulate charge carriers (e.g., electrons, holes) in response to incoming light received through an illuminated surface 224 of the semiconductor substrate 222 during an integration period of the image sensor. In some embodiments, the illuminated surface 224 is a backside surface or a front side surface of the semiconductor substrate 222. The photogenerated charge carriers accumulate in a charge accumulation region of photodiodes 230a-c, for example during the integration period of an image sensor, and can be selectively transferred to a floating diffusion, where the charge carriers are aggregated and then transferred to an active pixel area of the image sensor 200, i.e., to one or more source follower transistors, row select transistor, reset transistors, and the like. In some embodiments, the image sensor 200 comprises a floating diffusion formed in the semiconductor substrate and configured to aggregate charge carriers from the photodiodes 230a-c, a transfer structure (e.g., a vertical transfer gate) configured to form a charge carrier channel between the pixels 220a-c and the floating diffusion, and a control circuit operably coupled to bias the transfer structure in order to control movement of charge carriers from the pixels 220a-c to the floating diffusion. Although three photodiodes are shown in FIG. 2, this number is representative and not limiting.

A plurality of trench isolation structures 226a-d (distinct from CDTI structures described below) are formed in the semiconductor substrate 222 between each of the photodiodes 230a-c reduce crosstalk between pixels 220a. Trench isolation structures 226a-c extend away from the illuminated surface 224 into the semiconductor substrate 222, e.g., to a depth of about 100 nm to about 500 nm. Each photodiode 230 a, b, c is disposed between two trench isolation structures 226 a, b, c, d to prevent electrical and/or optical crosstalk. In any embodiment, the trench isolation structures extend to a deeper depth in the semiconductor substrate than the corresponding photodiode(s). In some embodiments, each trench isolation structure is a deep trench isolation (DTI) structure filled with passivation material (such as high k oxide material), dielectric material (such as silicon dioxide), reflective metal material, or a combination thereof. In some embodiments, each trench isolation structure is a shallow trench isolation (STI) trench structure or another trench structure.

A passivation layer 232 is disposed on the semiconductor substrate 222, and a buffer oxide layer 234 is disposed on the passivation layer 232. Passivation layer 232 comprises a dielectric material such as an oxide or high-k material, e.g., a material having a dielectric constant that is greater than about 3.9 (e.g., $Al_2O_3$ or $HfO_2$). In some embodiments, passivation layer 232 has a thickness of about 0.001 µm to about 0.10 µm, e.g., about 0.015 µm to about 0.055 µm. In some embodiments, passivation layer 232 contains negative fixed charges forming a hole accumulation layer surrounding the trench isolation structures 226a-d, which passivate sidewalls and bottom of trench isolation structures and prevent defects/traps from forming on the boundary (e.g., silicon-silicon oxide interface) during formation of the trench isolation structures. This prevents trapping electrons and/or holes generating dark current, which could affect the sensitivity of the photodiodes 230a-c. The amount of negative fixed charges contained in the passivation layer 232 or the hole density of the hole accumulation layer formed depend on the high-k material and the thickness of the layer. In some embodiments, passivation layer 232 is formed of material having refractive index between buffer oxide layer 234 (for example 1.4 for silicon dioxide) and semiconductor substrate 222 (for example, 3.9 for silicon substrate) and a thickness configured to function as anti-reflective coating to reduce the amount of reflection of incident light and enhancing light absorption of the photodiodes 230a-c.

In some embodiments, buffer oxide layer 234 is transparent to incident light, such as light with a high incident angle with respect to the backside illuminated surface 224. Such high incident angle light may penetrate the buffer oxide layer 234 and crosstalk between photodiodes.

A plurality of a grid elements 236a-d are disposed on an opposite side of the buffer oxide layer 234 relative to the photodiodes 230a-c. In particular, the grid elements 236a-d are disposed between the pixels 220a-c. Together, the grid elements 236a-d form a lattice-shaped grid which isolates the photodiodes 230a-c from each other by reflecting or absorbing high-angle incident light, as well as enhancing light sensitivity. The grid blocks at least a portion of high incident angle light, reducing crosstalk and improving light absorption of the photodiodes 230a-c. In this manner, the grid reduces optical crosstalk and its deleterious effects, e.g., petal flare.

Each of the grid elements 236a-d is formed at least partially from one or more materials such as silicon oxynitride, titanium nitride, aluminum, or tungsten, and is disposed at least partially in an oxide layer 242 at least partially aligned with one of the trench isolation structures 226a-d as shown. Some embodiments do not include a separate oxide layer 242 and one or more of the grid elements 236a-d is at least partially disposed in the buffer oxide layer 234. In some embodiments, one or more of the grid elements 236a-d may be shifted laterally to the left or right of a center line of a respective one of trench isolation structures 226a-d, for example to accommodate a chief ray angle (CRA) of incident light for better optical crosstalk performance.

Each grid element 236a-d has a thickness and a width. Thickness can range from about 0.025 µm to about 0.30 µm. In some embodiments, the thickness corresponds to a thickness of the oxide layer 242. The width is about 0.05 µm to about 0.25 µm, e.g., about 0.10 µm to about 0.15 µm. In some embodiments, the width of each grid element is about the same as, or less than, a width of the corresponding trench isolation structure over which the grid element is disposed.

Image sensor 200 also includes optional color filters 238a-c disposed over the grid, i.e., on an opposite side of the grid elements 236a-d from the photodiodes 230a-c. Color filters 238a-c absorb one or more wavelength ranges of visible light such that one or more photodiodes responds to one or more selected wavelength bands of visible light, e.g., red, green, blue, cyan, magenta, or yellow. In the non-limiting embodiment shown, color filters 238a-c include an array of discrete color filters, one or more of which may be configured to filter a different wavelength of color than another color filter. The color filters generally have a thickness between about 0.5 µm to about 0.8 µm, e.g., 0.6 µm or 0.7 µm. In some embodiments, one or more of the color filters has a different thickness from one or more other color filters.

In some embodiments, each color filter is formed above and aligned with a pixel center of a corresponding pixel. For example, color filter 238a is formed above photodiode 230a, and a center thereof is aligned with a pixel centerline 244 of the pixel 220a. In other embodiments, as described below, the color filters are shifted with respect to the respective pixel centers and the array center.

Optional lenses 240a-c are disposed over the photodiodes 230a-c to gather, direct, and focus incident light on the photodiodes 230a-c. In some embodiments, each of photodiodes 230a-c is formed above and aligned with the pixel center of a corresponding pixel. For example, lens 240a is formed above photodiode 230a, and a center thereof is aligned with the pixel centerline 244 of the pixel 220a. In other embodiments, as described below, the lenses are shifted with respect to the respective pixel centers and the array center.

Central deep trench isolation structures (hereinafter CDTI structures) are formed in a photosensitive region of each pixel. For example, in FIG. 2, CDTI structures 246a-c are respectively disposed in pixels 220a-c. In particular, CDTI structures 246a-c are disposed in the semiconductor substrate 222 between the illuminated surface 224 and respective photodiodes 230a-c. The CDTI structures are configured by virtue of their shape, size, and position relative to a pixel center and to the array center, to modify incident light at the backside illuminated surface 224 by at least one of diffraction, deflection and reflection, to redistribute the incident light within the respective photodiode to improve optical sensitivity, including near infrared (NIR) light sensitivity.

Each of the CDTI structures 246a-c comprises a deposit of dielectric material disposed in the semiconductor substrate 222 and having a refractive index smaller than the refractive index of the semiconductor substrate 222. Generally, each CDTI structure extends between the illuminated surface 224 of the semiconductor substrate 222 and a corresponding photodiode, i.e., the CDTI structure generally does not extend to or beyond the corresponding photodiode. In some examples, the dielectric material of each CDTI structure may include oxides/nitrides such as silicon oxide ($SiO_2$), hafnium oxide ($HfO_2$), silicon nitride ($Si_3N_4$), silicon oxynitride (SiOxNy), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide (Tm$_2$O$_3$), ytterbium oxide (Yb$_2$O$_3$), lutetium oxide (Lu$_2$O$_3$), yttrium oxide (Y$_2$O$_3$), or the like. Additionally, one skilled in the relevant art will recognize that any stoichiometric combination of the above metals/semiconductors and their oxides/nitrides/oxynitrides may be used, as long as they have a refractive index smaller than the refractive index of the semiconductor substrate 222.

In some embodiments, each CDTI structure may also include a liner material disposed between the corresponding photodiode and the dielectric material. In some examples, the liner material may include at least one of a negatively charged high k dielectric material, or a doped semiconductor material. For example, a trench could be etched and boron, nitrogen, or arsenic could be implanted into the sidewalls of the trench to form a doped semiconductor material as the liner material. Alternatively, a trench could be etched and hafnium oxide could be deposited in the trench to form a negatively charged high-k liner material before the core dielectric material is deposited into the trench.

Figure 4:
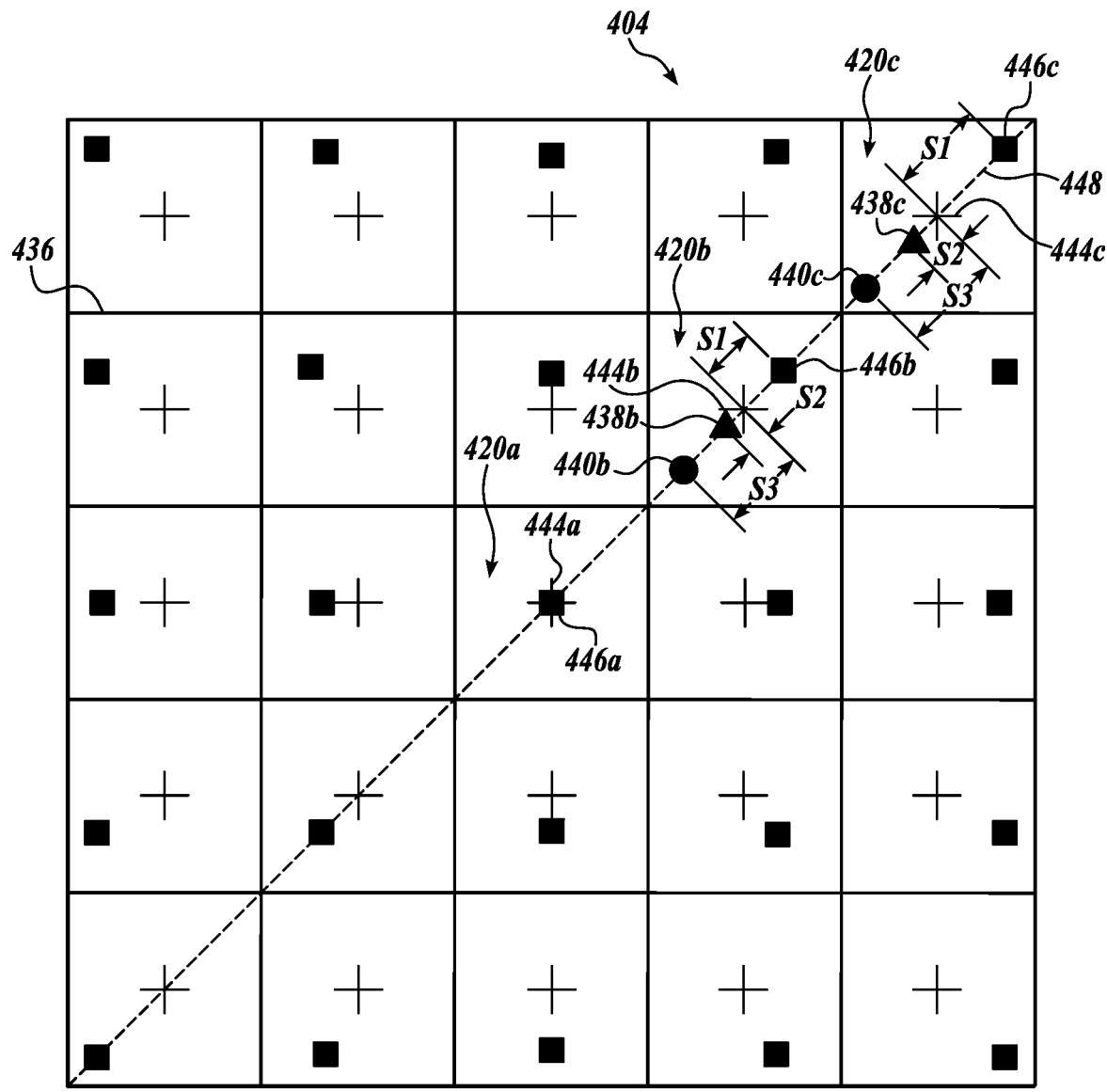
FIG. 4 is a schematic top view of a pixel array according to an embodiment of the present disclosure, in which certain of the CDTI structures are shifted relative to the respective pixel centers and the array center.

In FIG. 2 and throughout this disclosure, each CDTI structure has a parallelepiped shape, e.g., a cube shape having a side length of about 0.2 µm to about 0.5 µm when viewed from a perspective perpendicular to the illuminated surface (as shown in FIG. 4), and extending into the semiconductor substrate from the illuminated surface 224 by a depth of about 0.1 µm to about 0.5 µm. However, this is representative and not-limiting. For example, in any embodiment disclosed herein, any one or more CDTI structures may be a polygon, cylinder, an ellipsoid, a hemispheroid, or a hemisphere shape, for example.

While CDTI structures can improve the quantum efficiency (QE) of an image sensor, they also lead to crosstalk between pixels. The inventors have discovered that systematic shifting of the CDTI structure in one or more pixels can reduce crosstalk between pixels without reducing QE by scattering light and reducing the amount of light entering neighboring pixels. Optionally, additional pixel elements are shifted in addition to the CDTI structure to further reduce crosstalk.

Figure 3:
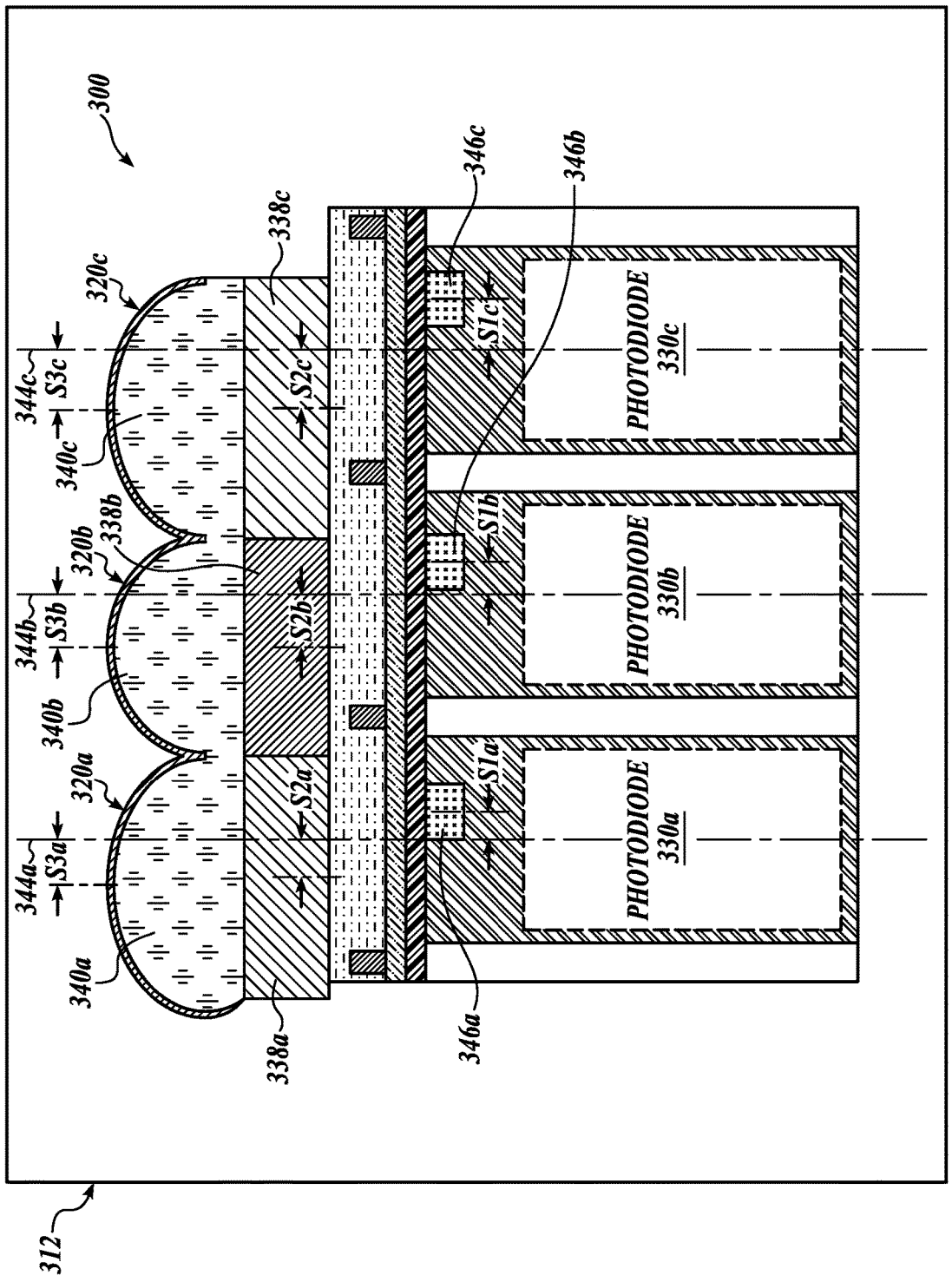
FIG. 3 is a schematic cross section of a pixel according to the present disclosure, in which microlenses, color filters, and CDTI structures are all shifted relative to a pixel center.

To illustrate this concept, FIG. 3 provides a schematic cross section of a portion of an image sensor 300, which is identical to the image sensor 200 of FIG. 2 except for the differences discussed below. Accordingly, alike reference numerals have alike meanings and will not be reintroduced.

As shown, each of pixels 320a-c have common features, including a lens (e.g., 340a), a color filter (e.g., 338a), and a CDTI structure (e.g., 346a). For reference, FIG. 3 shows a pixel centerlines (e.g., 344a, b, c) extending through a center of each pixel and corresponding to the respective pixel center.

In order to reduce crosstalk, the CDTI structures of one or more pixels are shifted relative to the pixel centerline. For example, the CDTI structures of each pixel 320a, b, and c are shifted relative to the respective pixel centerlines. In particular, CDTI structures 346a, b, c are shifted by CDTI shift distances S1a, b, c in a first direction away from the pixel centerline 344a. The CDTI shift distances S1a, b, c are each defined as a linear distance between a respective pixel center (e.g., pixel centerline 344a) and a center of the CDTI structure (e.g., a center of CDTI structure 346a). FIG. 3 shows each CDTI structure shifted by a different CDTI shift distance S1. In this non-limiting example, CDTI structure 346b is shifted by a greater shift distance S1b than CDTI structure 346a, and CDTI structure 346c is shifted by a greater shift distance S1c than CDTI structure 346b. In some embodiments such as described in FIG. 4, the CDTI shift distance is a function of a distance between the array center and the pixel center (e.g., a field). For example, in any embodiment, the CDTI shift distance may be expressed as any one of the following functions:

$$0.1\times < \text{CDTI shift distance}(x) < 0.5\times,$$

$$0.2\times < \text{CDTI shift distance}(x) < 0.4\times, \text{ or}$$

$$0.3\times < \text{CDTI shift distance}(x) < 0.4\times,$$

wherein CDTI shift distance is measured in micrometers (m) or other length unit, and wherein x represents a field of the pixel, wherein the field is a value between 0 and 1 defined as a relative position of the pixel between the array center and an outermost pixel position in the pixel array, wherein 0 corresponds to the array center and 1 corresponds to the outermost pixel position, with intermediate field values representing interpolated points in between. Restated, the field is a measure of a distance between the pixel center from the array center. For example, referring to the third equation above, a pixel having a field of 1.0 (an outermost pixel position in the pixel array) may have a CDTI shift distance between (inclusive) 0.3 µm and 0.4 µm, whereas the center pixel (i.e., a pixel having a field of 0) would have a CDTI shift distance of 0.

Accordingly, in image sensors having pixels disposed at different distances away from the array center (different fields), different pixels may have different CDTI shift distances. For example, in embodiments having a pixel array comprising a first pixel disposed a first distance away from the array center and a second pixel disposed a greater second distance away from the array center (i.e., closer to the outermost pixel position), the CDTI shift distance is greater for the second pixel than the first pixel.

In any pixel of any embodiment, the CDTI shift distance for any CDTI structure may be from about 0.10 µm to about 0.50 µm, e.g., about 0.15 µm to about 0.45 µm, about 0.20 µm to about 0.40 µm, about 0.25 µm to about 0.35 µm, about 0.15 µm to about 0.50 µm, about 0.20 µm to about 0.50 µm, about 0.25 µm to about 0.50 µm, about 0.30 µm to about 0.50 µm, about 0.35 µm to about 0.50 µm, about 0.40 µm to about 0.50 µm, about 0.10 µm to about 0.45 µm, about 0.10 µm to about 0.40 µm, about 0.10 µm to about 0.35 µm, about 0.10 µm to about 0.30 µm, about 0.10 µm to about 0.25 µm, or about 0.10 µm to about 0.20 µm.

In some embodiments, the first direction of the CDTI shift distance is away from the pixel centerline 344a and also away from an array center (i.e., away from a center of a pixel array in which pixel 320a resides). Restated, each of CDTI structures 246a-c may be shifted in a first direction away from the array center and from the corresponding pixel center. In some embodiments, the first direction is along a vector oriented along the pixel center and the array center. In some embodiments, the CDTI structure is shifted by the CDTI shift distance away from the array center and away from the pixel center along the foregoing vector.

Advantageously, the inventors have discovered that shifting the CDTI structure relative to the pixel center and array center reduces crosstalk.

Optionally, one or more other pixel grid elements are shifted in addition to the CDTI structure to further reduce crosstalk. As shown in FIG. 3, each color filter and each lens is shifted relative to the corresponding pixel center in a second direction (different or even opposite to the first direction in which the CDTI structure is shifted). For example, color filter 338a is shifted by a CF shift distance S2a in a second direction relative to pixel centerline 344a (the pixel center), and lens 340a is shifted by a lens shift distance S3a in the second direction relative to pixel centerline 344a. For example, in FIG. 3, CDTI structure 346a is shifted to the right of the pixel centerline 344a, while color filter 338a and lens 340a are shifted to the left of the pixel centerline 344a. In some embodiments, the CDTI structure, color filter, and lens are all shifted along the vector oriented along the pixel center and the array center, but with the CDTI structure shifted in an opposite direction relative to the pixel center from the color filter and lens.

The CF shift distances S2a, b, c are defined as a linear distance between a pixel center (e.g., pixel centerline 344a) and a center of the respective color filter (e.g., color filter 338a). FIG. 3 shows that each color filter 338a, b, c is shifted by a different shift distance S2a, b, c. For example, in some embodiments, the CF shift distance is a function of a distance between the array center and the pixel center, i.e., field. For example, in any embodiment, the CF shift distance may be expressed as any one of the following functions:

$0.1 \times <$ CF shift distance$(x) < 0.3 \times$, $0.1 \times <$ CF shift distance$(x) < 0.2 \times$, or $0.1 \times <$ CF shift distance$(x) < 0.15 \times$, wherein CF shift distance S2 is measured in m or other length unit, and wherein x represents the field of the pixel (as defined above). For example, referring to the third equation above, a pixel having a field of 1.0 (an outermost pixel position in the pixel array) may have a CF shift distance S2 between (inclusive) of 0.10 μm and 0.15 μm, whereas the center pixel (i.e., a pixel having a field of 0) would have a CF shift distance S2 of 0.

Accordingly, in image sensors having pixels disposed at different distances away from the array center, different pixels may have different CF shift distances S2. For example, in embodiments having a pixel array comprising a first pixel disposed a first distance away from the array center and a second pixel disposed a greater second distance away from the array center, the CF shift distance S2 is greater for the second pixel than the first pixel.

In any pixel of any embodiment, the CF shift distance S2 may be from about 0.10 μm to about 0.50 μm, e.g., about 0.15 μm to about 0.45 μm, about 0.20 μm to about 0.40 μm, about 0.25 μm to about 0.35 μm, about 0.15 μm to about 0.50 μm, about 0.20 μm to about 0.50 μm, about 0.25 μm to about 0.50 μm, about 0.30 μm to about 0.50 μm, about 0.35 μm to about 0.50 μm, about 0.40 μm to about 0.50 μm, about 0.10 μm to about 0.45 μm, about 0.10 μm to about 0.40 μm, about 0.10 μm to about 0.35 μm, about 0.10 μm to about 0.30 μm, about 0.10 μm to about 0.25 μm, or about 0.10 μm to about 0.20 μm.

The lens shift distance S3a, b, c is defined as a linear distance between a pixel center (e.g., pixel centerline 344a) and a center of the respective lens (e.g., lens 340a). FIG. 3 shows that each lens 340a, b, c is shifted by a different shift distance S2a, b, c. For example, in some embodiments, the lens shift distance S3 is a function of a distance between the array center and the pixel center. For example, in any embodiment, the lens shift distance S3 may be expressed as any one of the following functions:

$0.6 \times <$ lens shift distance$(x) < 0.8 \times$, $0.65 \times <$ lens shift distance$(x) < 0.75 \times$, or $0.7 \times <$ lens shift distance$(x) < 0.725 \times$, wherein lens shift distance S3 is measured in m or other length unit, and wherein x represents the field of the pixel (as defined above). For example, referring to the third equation above, a pixel having a field of 1.0 (an outermost pixel position in the pixel array) may have a lens shift distance S3 between (inclusive) of 0.70 μm and 0.725 μm, whereas the center pixel (i.e., a pixel having a field of 0) would have a lens shift distance S3 of 0.

Accordingly, in image sensors having pixels disposed at different distances away from the array center, different pixels may have different lens shift distances S3. For example, in such embodiments having a pixel array comprising a first pixel disposed a first distance away from the array center and a second pixel disposed a greater second distance away from the array center, the lens shift distance S3 is greater for the second pixel than the first pixel.

In any pixel of any embodiment, the lens shift distance S3 may be from about 0.10 μm to about 1.00 μm, e.g., about 0.5 μm to about 1.0 μm, about 0.6 μm to about 1.0 μm, about 0.7 μm to about 1.0 μm, about 0.8 μm to about 1.0 μm, about 0.5 μm to about 0.90 μm, about 0.6 μm to about 0.90 μm, about 0.70 μm to about 0.90 μm, about 0.80 μm to about 0.90 μm, or about 0.85 μm to about 0.90 μm.

In any pixel described herein having a nonzero field (i.e., the pixel center is not coincident with the array center), the CDTI shift distance S1 may differ from the corresponding CF shift distance S2 and the corresponding lens shift distance S3. For example, in any pixel described herein having a nonzero field, the CDTI shift distance S1 may be greater than the corresponding CF shift distance S2, but less than the corresponding lens shift distance S3. Furthermore, in any pixel described herein having a nonzero field, the CDTI shift distance S1 may be in a different direction from the CF shift distance S2 and the lens shift distance S3. For example, in any such embodiment, the CDTI structure may be shifted away from the array center and away from the pixel center along a vector oriented along the pixel center and the array center, whereas the color filter and/or the lens may be shifted toward the array center and away from the pixel center along the same vector.

FIG. 4 shows a representative pixel array 404 embodying certain features described above with respect to FIG. 3. Pixel array 404 includes a plurality of pixels (e.g. pixel 420a-c) arranged in a representative 5×5 pattern. This 5×5 layout is representative, not limiting. Each pixel of the pixel array 404 has the features described above with respect to the pixels of FIG. 3, e.g., a photodiode, a CDTI structure, a color filter, and a lens. An optional grid 436 is disposed between the pixels. For simplicity, these features are described with respect to pixels 420a-c; however, a skilled artisan shall appreciate that the other pixels of pixel array 404 have the same features.

The concepts will now be further described with respect to several representative pixels 420a-c. Pixel 420a has a pixel center 444a coincident with an array center of the pixel array 404, and accordingly has a field of 0.0. Pixel 420a also has a color filter and a lens coincident with the pixel center 444a and the array center. A CDTI structure 446a is disposed between the color filter and lens, and is coincident with the pixel center 444a. In this embodiment, none of the color filter, the lens, or the CDTI structure 446a are shifted relative to the array center or pixel center because pixel 420a has a field of 0, i.e., is coincident with the array center.

By comparison, pixel 420c is disposed in the corner of the pixel array 404, i.e., the outermost pixel position of the pixel array, and accordingly has a field of 1.0. Pixel 420c has a color filter 438c, a lens 440c, and a CDTI structure 446c. Each of color filter 438c, lens 440c, and CDTI structure 446c are disposed (shifted) along a vector 448 oriented along the pixel center 444c and the array center. In particular, color filter 438c and lens 440c are respectively shifted by a CF shift distance and a lens shift distance along the vector 448 away from the pixel center 444c and toward the array center, whereas CDTI structure 446c is shifted by a CDTI shift distance along the vector 448 away from the pixel center 444c and away from the array center. Each of the CDTI shift distance, CF shift distance, and lens shift distance may have any of the values and/or relationships to the pixel field as described above with respect to FIG. 3

In the embodiment shown, the CDTI shift distance of any pixel is greater than the CF shift distance but less than the lens shift distance. And, given that pixel 420c has a field of 1.0, the CDTI shift distance, CF shift distance, and lens shift distance are each greater than the corresponding parameters of every other pixel in the pixel array 404 having a different field. To clarify, other pixels having the same field (i.e., the three other corner pixels) would have the same CDTI shift distance, CF shift distance, and lens shift distance. In some embodiments, one or both of the color filter 438c and lens 440c are not shifted, i.e., only the CDTI structure 446c is shifted.

In between pixel 420a and pixel 420c lies pixel 420b, which has a field of approximately 0.5 in this example. Like the other pixels, pixel 420b has a color filter 438b, a lens 440b, and a CDTI structure 446b. Like pixel 420c, each of the color filter 438b, lens 440b, and the CDTI structure 446b are shifted along the vector 448, which is also oriented along the pixel center 444b and the array center. However, the CDTI shift distance S1, CF shift distance S2, and lens shift distance S3 are each less (e.g., about half) in pixel 420b as compared to pixel 420c because pixel 420b has a field of about 0.5 as compared to 1.0. To clarify, other pixels having the same field as pixel 420b would have the same CDTI shift distance, CF shift distance, and lens shift distance.

CDTI structure 446b is shifted by a CDTI shift distance S1 along the vector 448 away from the array center, color filter 438b is shifted by a CF shift distance S2 along the vector 448 toward the array center, and lens 440b is shifted by a lens shift distance S3 along the vector 448 toward the array center. Each of the CDTI shift distance S1, CF shift distance S2, and lens shift distance S3 may have any of the values and/or relationships to the pixel field as described above with respect to FIG. 3. In some embodiments, one or both of the color filter 438b and lens 440b are not shifted, i.e., only the CDTI structure 446b is shifted.

Although the CDTI shift, CF shift, and lens shift are described above only with respect to pixels 420a-c, it shall be appreciated that pixels having a common field (e.g., all corner pixels) share common CDTI shift distance Si, CF shift distance S2, and lens shift distance S3 in the illustrated embodiment. In other embodiments, only the CDTI structure of each pixel is shifted, and the color filter and lens are not shifted. In still other embodiments, one or more of the CDTI structures is shifted by a CDTI shift distance as described above, but not all pixels having a same field have a same CDTI shift distance.

As shown, as a result of the foregoing structure, different pixels of the pixel array 404 have different CDTI shift distances, CF shift distances, and lens shift distances, which may be a function of the field of each pixel. Shifting the CDTI structures alone improves pixel crosstalk. Shifting the CDTI structures in a first direction, in addition to shifting the color filters and lenses in an opposite second direction results in further improvement.

Figure 5:
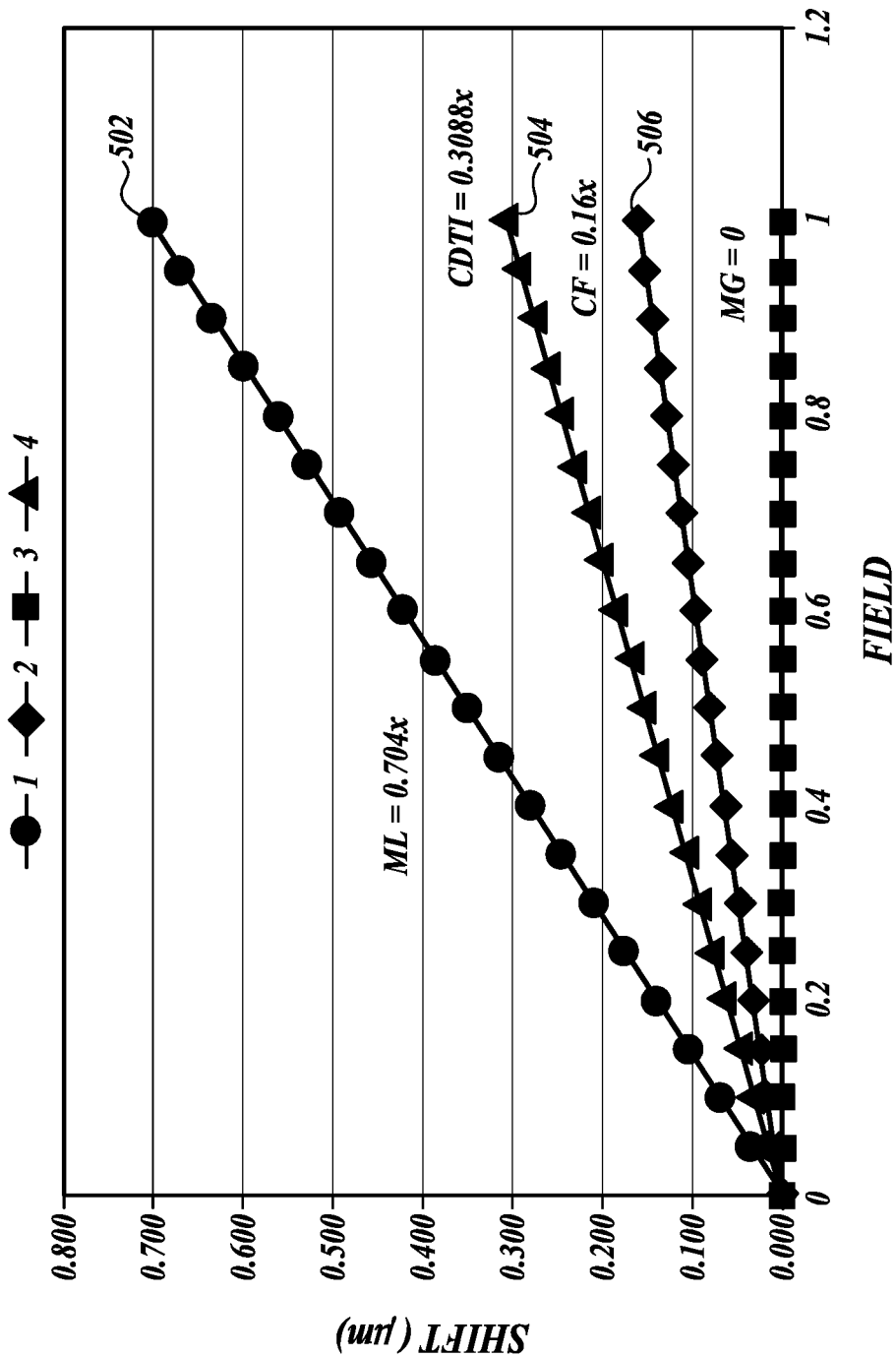
FIG. 5 is a graph showing a shift of a lens, a color filter, and a CDTI structure of a pixel as a function of a distance between the pixel center from the array center.

FIG. 5 is a chart showing one representative relationship between lens shift distance 502, CDTI shift distance 504, and CF shift distance 506 in an image sensor, which has been discovered to reduce pixel crosstalk. As shown, each of the lens shift distance 502, CDTI shift distance 504, and CF shift distance 506 of a given pixel are functions of the field of the pixel, i.e., between 0 and 1. In particular, lens shift distance 502 may be described as about 0.7× to about 0.8×, CDTI shift distance 504 may be described as about 0.3× to about 0.4×, and CF shift distance 506 may be described as about 0.1× to about 0.2×. In the foregoing example, each shift distance is measured in m, and x represents the field of the pixel, wherein the field is a value between 0 and 1 defined as a relative position of the pixel between the array center and an outermost pixel position in the pixel array, wherein 0 corresponds to the array center and 1 corresponds to the outermost pixel position. Note, the chart of FIG. 5 does not indicate the direction in which the CDTI structure, lens, or color filter are shifted. As described above, in some embodiments, each such shift is along a vector oriented along the pixel center and the array center. Further still, in some embodiments, the CDTI shift is along the vector and away from the array center, whereas the CF shift and the lens shift are along the vector and toward the array center.

Figure 6A:
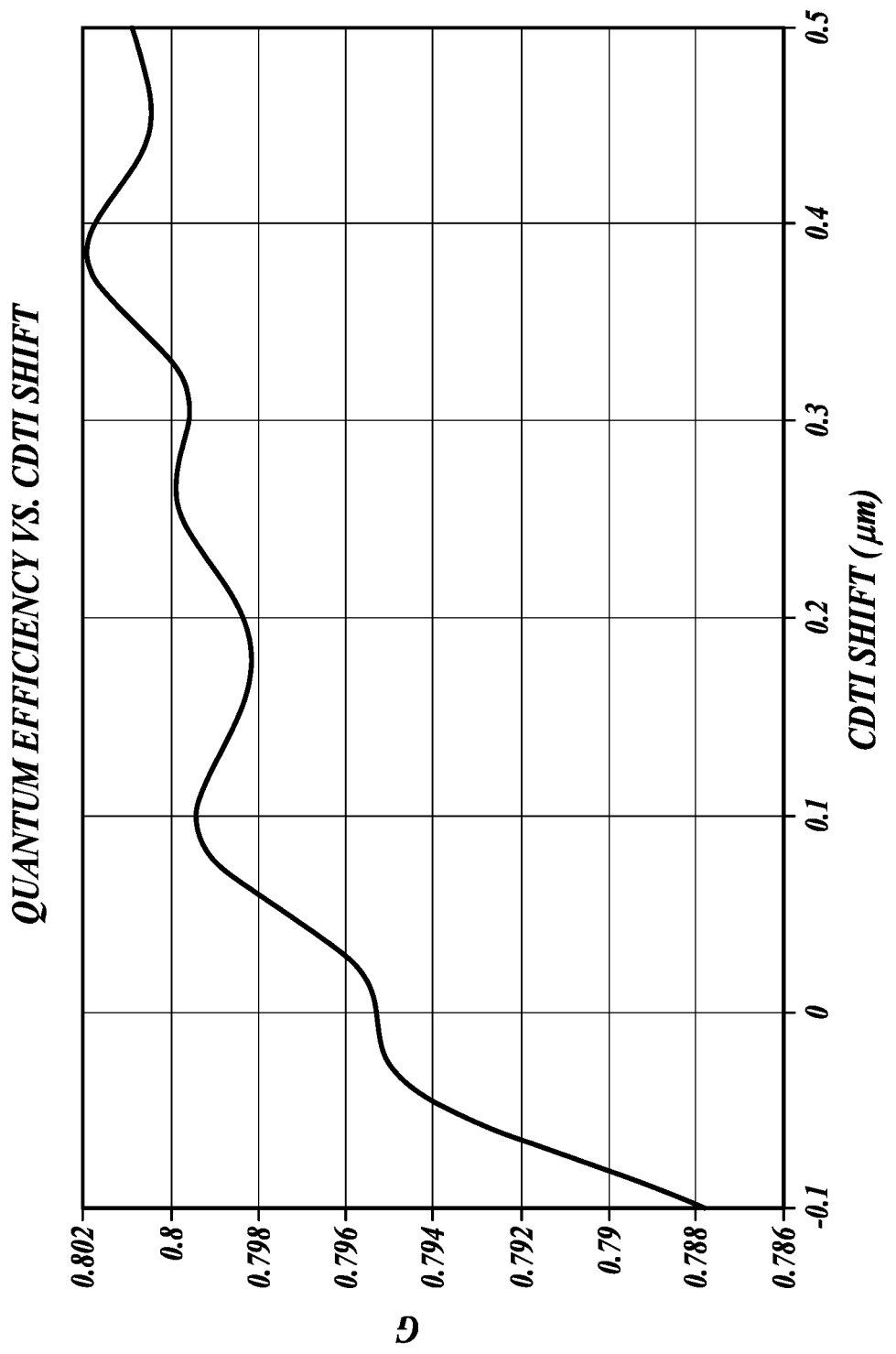
FIG. 6A is a graph showing quantum efficiency changes as a function of CDTI shift.

FIG. 6A is a graph showing changes in quantum efficiency as a function of CDTI shift relative to the array center. In particular, the y-axis represents green channel QE at a green wavelength (e.g., 530 nm) under the chief ray angle target angle (e.g., 35 degrees), whereas the x-axis represents the CDTI shift of a single pixel relative to the array center (in μm). Positive CDTI shift corresponds to shift away from the array center. As shown, when the CDTI shift is greater than zero, QE improves.

Figure 6B:
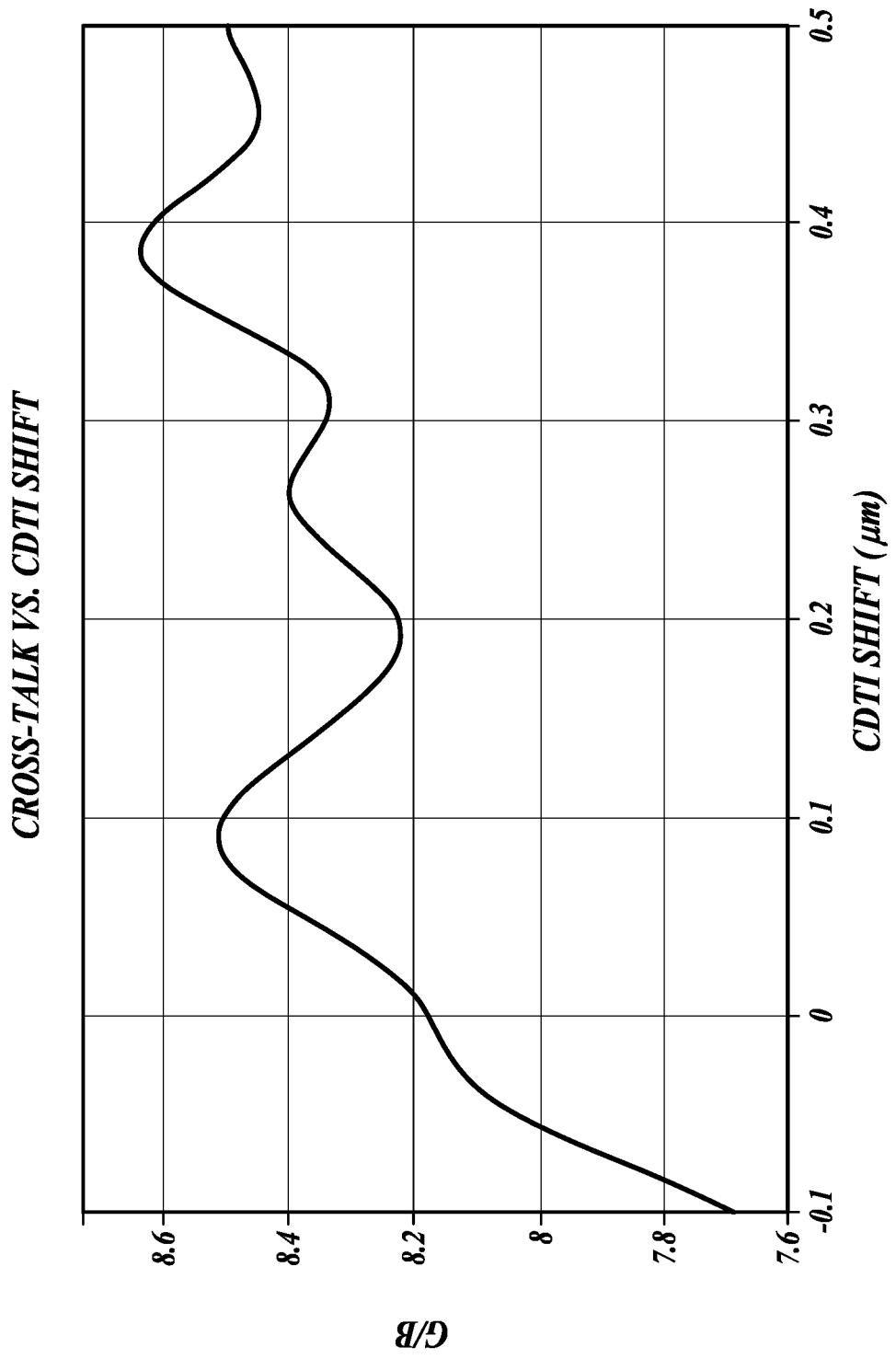
FIG. 6B is a graph showing crosstalk changes as a function of CDTI shift.

FIG. 6B is a graph showing changes in crosstalk as a function of CDTI shift relative to the array center. In particular, the y-axis represents color ratio at a green wavelength (e.g., 530 nm) under the chief ray angle target angle (e.g., 35 degrees), whereas the x-axis represents the CDTI shift of a single pixel relative to the array center (in μm). Positive CDTI shift corresponds to shift away from the array center. As shown, when the CDTI shift is greater than zero, crosstalk improves. Indeed, comparing FIGS. 6A and 6B, it can be seen that both QE and crosstalk improves as CDTI shift increases from zero, and there are CDTI shift values for which QE and crosstalk both reach optimum levels.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a pixel array arranged about an array center, each pixel of the pixel array comprising:
a photodiode formed in a semiconductor substrate; and
a central deep trench isolation structure disposed in the semiconductor substrate relative to a pixel center between the photodiode and an illuminated surface of the semiconductor substrate, wherein the central deep trench isolation structure is disposed at a CDTI shift distance away from the pixel center unless the pixel center is coincident with the array center, wherein for a plurality of pixels of the pixel array, the CDTI shift distance is defined by a function of a distance between the pixel center from the array center, wherein for each pixel:

$$0.3x < \text{CDTI shift distance}(x) < 0.4x,$$

wherein the CDTI shift distance is measured in pm, and wherein x represents a field of the pixel, wherein the field is a value between 0 and 1 defined as a relative position of the pixel between the array center and an outermost pixel position in the pixel array, wherein 0 corresponds to the array center and 1 corresponds to the outermost pixel position.

2. The image sensor of claim 1, wherein each pixel further comprises:
a lens disposed over the photodiode, wherein the lens is disposed at a lens shift distance away from the pixel center; and
a color filter disposed between the photodiode and the lens, wherein the color filter is disposed at a CF shift distance away from the pixel center,
wherein the CDTI shift distance differs from at least one of the lens shift distance or the CF shift distance.

3. The image sensor of claim 2, wherein for each pixel, the central deep trench isolation structure, the lens, and the color filter are disposed along a vector oriented from the pixel center of each pixel to the array center.

4. The image sensor of claim 3, wherein for each off-center pixel, the central deep trench isolation structure is disposed along the vector away from the array center with respect to the pixel center of each off-center pixel.

5. The image sensor of claim 4, wherein for each off-center pixel, at least one of the lens or the color filter is disposed along the vector toward the array center with respect to the pixel center of each off-center pixel.

6. The image sensor of claim 2, wherein the pixel array further comprises a grid having grid elements disposed between the pixels.

7. The image sensor of claim 1, further comprising:
a control circuit configured for controlling movement of charge carriers from the pixel array.

8. An electronic device comprising the image sensor of claim 1.

9. An image sensor, comprising:
a pixel array arranged about an array center, each pixel of the pixel array comprising:
a photodiode formed in a semiconductor substrate; and
a central deep trench isolation structure disposed in the semiconductor substrate relative to a pixel center between the photodiode and an illuminated surface of the semiconductor substrate, wherein the central deep trench isolation structure is disposed at a CDTI shift distance away from the pixel center unless the pixel center is coincident with the array center,
wherein each pixel further comprises:
a lens disposed over the photodiode, wherein the lens is disposed at a lens shift distance away from the pixel center; and
a color filter disposed between the photodiode and the lens, wherein the color filter is disposed at a CF shift distance away from the pixel center,
wherein the CDTI shift distance differs from at least one of the lens shift distance or the CF shift distance,
wherein for each pixel, the central deep trench isolation structure, the lens, and the color filter are disposed along a vector oriented from the pixel center of each pixel to the array center,
wherein for each off-center pixel, the central deep trench isolation structure is disposed along the vector away from the array center with respect to the pixel center of each off-center pixel, and
wherein for each pixel, the CDTI shift distance, the lens shift distance, and the CF shift distance are all represented by different functions of a distance between the pixel center and the array center.

10. The image sensor of claim 8, wherein for each pixel:

$$0.1x < \text{CF shift distance}(x) < 0.2x,$$

$$0.3x < \text{CDTI shift distance}(x) < 0.4x,$$

$$0.7x < \text{lens shift distance}(x) < 0.8x,$$

wherein the CF shift distance, the CDTI shift distance, and the lens shift distance are measured in pm, and wherein x represents a field of the pixel, wherein the field is a value between 0 and 1 defined as a relative position of the pixel between the array center and an outermost pixel position in the pixel array, wherein 0 corresponds to the array center and 1 corresponds to the outermost pixel position.

11. An image sensor, comprising:
a pixel array arranged about an array center, each pixel of the pixel array comprising:
a photodiode formed in a semiconductor substrate; and
a central deep trench isolation structure disposed in the semiconductor substrate relative to a pixel center between the photodiode and an illuminated surface of the semiconductor substrate, wherein the central deep trench isolation structure is disposed at a CDTI shift distance away from the pixel center unless the pixel center is coincident with the array center,
wherein each pixel further comprises:
a lens disposed over the photodiode, wherein the lens is disposed at a lens shift distance away from the pixel center; and
a color filter disposed between the photodiode and the lens, wherein the color filter is disposed at a CF shift distance away from the pixel center,
wherein the CDTI shift distance differs from at least one of the lens shift distance or the CF shift distance,
wherein for each pixel, the central deep trench isolation structure, the lens, and the color filter are disposed along a vector oriented from the pixel center of each pixel to the array center,
wherein for each off-center pixel, the central deep trench isolation structure is disposed along the vector away from the array center with respect to the pixel center of each off-center pixel,
wherein for each off-center pixel, at least one of the lens or the color filter is disposed along the vector toward the array center with respect to the pixel center of each off-center pixel, and
wherein for each pixel, the lens shift distance is greater than the CDTI shift distance.

12. The image sensor of claim 11, wherein for each pixel, the CDTI shift distance is greater than the CF shift distance.

\* \* \* \* \*

UNITED STATES PATENT AND TRADEMARK OFFICE
CERTIFICATE OF CORRECTION

PATENT NO. : 12,471,394 B2
APPLICATION NO. : 17/680045
DATED : November 11, 2025
INVENTOR(S) : Hui Zang et al.

It is certified that error appears in the above-identified patent and that said Letters Patent is hereby corrected as shown below:

In the Claims

| Column | Line | |
|---|---|---|
| 13 | 10 | Claim 1, delete "0.3×<CDTI shift distance(x)<0.4×," and insert -- 0.3×≤CDTI shift distance(x)≤0.4×, -- |
| 13 | 12 | Claim 1, delete "pm," and insert -- μm, -- |
| 14 | 17 | Claim 10, delete "claim 8," and insert -- claim 9, -- |
| 14 | 19 | Claim 10, delete "0.1×<CF shift distance($x$)<0.2×," and insert -- 0.1×≤CF shift distance($x$)≤0.2×, -- |
| 14 | 21 | Claim 10, delete "0.3×<CDTI shift distance($x$)<0.4×," and insert -- 0.3×≤CDTI shift distance($x$)≤0.4×, -- |
| 14 | 24 | Claim 10, delete "0.7×<lens shift distance($x$)<0.8×," and insert -- 0.7×≤lens shift distance($x$)≤0.8×, -- |
| 14 | 26 | Claim 10, delete "pm," and insert -- μm, -- |

Signed and Sealed this
Third Day of February, 2026

John A. Squires
*Director of the United States Patent and Trademark Office*